United States Patent
Li et al.

(10) Patent No.: US 7,842,522 B2
(45) Date of Patent: Nov. 30, 2010

(54) WELL FORMATION

(75) Inventors: Yunjun Li, Austin, TX (US); Richard Lee Fink, Austin, TX (US); Mohshi Yang, Austin, TX (US); Zvi Yaniv, Austin, TX (US)

(73) Assignee: Applied Nanotech Holdings, Inc., Austin, TX (US)

( * ) Notice: Subject to any disclaimer, the term of this patent is extended or adjusted under 35 U.S.C. 154(b) by 345 days.

(21) Appl. No.: 10/937,437

(22) Filed: Sep. 9, 2004

(65) Prior Publication Data

US 2005/0095360 A1    May 5, 2005

Related U.S. Application Data

(63) Continuation-in-part of application No. 10/269,577, filed on Oct. 11, 2002, now Pat. No. 7,195,938.

(60) Provisional application No. 60/502,454, filed on Sep. 12, 2003, provisional application No. 60/343,642, filed on Oct. 19, 2001, provisional application No. 60/348,856, filed on Jan. 15, 2002, provisional application No. 60/369,794, filed on Apr. 4, 2002.

(51) Int. Cl.
  *H01L 21/00* (2006.01)
  *H01L 51/56* (2006.01)

(52) U.S. Cl. .......................... 438/20; 438/99; 977/939; 977/858; 977/857; 257/E51.04

(58) Field of Classification Search ................ 438/20, 438/99; 313/310; 156/247; 441/51; 977/DIG. 1, 977/939, 857, 858; 257/E51.04, E51.018
See application file for complete search history.

(56) References Cited

U.S. PATENT DOCUMENTS

| | | | | |
|---|---|---|---|---|
| 5,948,465 A | * | 9/1999 | Blanchet-Fincher et al. | .. 427/77 |
| 6,057,637 A | * | 5/2000 | Zettl et al. | ......... 313/310 |
| 6,239,547 B1 | * | 5/2001 | Uemura et al. | ....... 313/495 |
| 6,250,984 B1 | * | 6/2001 | Jin et al. | ............. 445/51 |
| 6,299,812 B1 | * | 10/2001 | Newman et al. | ..... 264/176.1 |
| 6,409,567 B1 | * | 6/2002 | Amey et al. | ......... 445/50 |

(Continued)

FOREIGN PATENT DOCUMENTS

CN    1440561    9/2003

(Continued)

OTHER PUBLICATIONS

Chung et al. "Field emision display using self-aligned carbon nanotube field emitters", Jun. 2001, IEEE, pp. 179-180.*

(Continued)

*Primary Examiner*—Mary Wilczewski
(74) *Attorney, Agent, or Firm*—Kelly Kordzik; Matheson Keys Garsson & Kordzik

(57) ABSTRACT

Composition of carbon nanotubes (CNTs) are produced into inks that are dispensable via ink jet or other deposition processes. The CNT ink is dispensed into wells and allowed to dry so as to formed a cathode structure. It is important to note that after the CNT ink is deposited to form a cathode structure, no further post-deposition processes are performed, such as the removal of sacrificial layers, which could damage the CNT ink.

14 Claims, 7 Drawing Sheets

U.S. PATENT DOCUMENTS

| | | | |
|---|---|---|---|
| 6,436,221 B1 * | 8/2002 | Chang et al. | 156/247 |
| 6,440,761 B1 * | 8/2002 | Choi | 438/20 |
| 6,653,366 B1 * | 11/2003 | Imai et al. | 523/160 |
| 6,705,910 B2 | 3/2004 | Sheu et al. | 445/24 |
| 6,811,457 B2 * | 11/2004 | Cheng et al. | 445/24 |
| 2002/0074932 A1 * | 6/2002 | Bouchard et al. | 313/495 |
| 2003/0049875 A1 | 3/2003 | Sheu et al. | |
| 2003/0092207 A1 | 5/2003 | Yaniv et al. | |
| 2003/0141798 A1 | 7/2003 | Jin et al. | |
| 2005/0095360 A1 * | 5/2005 | Li et al. | 427/240 |
| 2005/0275331 A1 | 12/2005 | Takai et al. | |

FOREIGN PATENT DOCUMENTS

| | | |
|---|---|---|
| EP | 0905737 | 3/1999 |
| EP | 0989579 | 3/2000 |
| EP | 1408525 A1 | 4/2004 |
| JP | 2002170480 | 6/2002 |
| JP | 2003-100202 | 4/2003 |
| JP | 2003-229044 | 8/2003 |
| WO | WO 02/03413 | 1/2002 |
| WO | WO 02/41348 | 5/2002 |
| WO | WO 02/075826 | 9/2002 |

OTHER PUBLICATIONS

Nam et al. "A novel paste for carbon nanotube FED", Jun. 2001, IEEE, pp. 57-58.*
Lee et al. "Low-cost fabrication of triode structure carbon nanotube field emission display", Jun. 2001, IEEE, pp. 191-192.*
Vivien et al. "Pump-probe experiments at 1064 nm in singlewall carbon nanotube suspensions", Jun. 2000, IEEE, pp. 680-686.*
PCT/US07/62987 International Search Report, dated Oct. 3, 2007.
Japanese Office Action received in Application No. 2006-526386 on Apr. 7, 2009; 3 pages.
"Potassium Silicate Products and Specifications," PQ Corporation, 2007, pp. 1-4.
Beneke et al. "A hydrated potassium layer silicate and its crystalline silicic acid," Am Mineral. 1989, V74, pp. 224-229.
"Water Glass," The Columbia Encyclopedia, Sixth Edition, 2008.
"Potassium Silicate, Water Glass," 77750, Kremer Pigmente, 2008.
European Search Report for International Application No. 04783947.7 mailed Jul. 24, 2009, 5 pages.

* cited by examiner

WELL FORMATION

This patent application claims priority to U.S. Provisional Patent Application Ser. No. 60/502,454, filed Sep. 12, 2003. This patent application is a continuation-in-part of U.S. patent application Ser. No. 10/269,577, which claims priority to U.S. Provisional Patent Applications Ser. Nos. 60/343,642; 60/348,856; and 60/369,794.

TECHNICAL FIELD

The present invention relates in general to depositing carbon nanotubes with CNT inks into well structures.

BACKGROUND INFORMATION

Cathode uniformity is a critical factor for commercializing field emission displays (FEDs). Carbon nanotube (CNT) materials have the highest potential as cathode materials for future FEDs. Uniformly and selectively depositing CNTs over a large substrate is one of the main issues for an FED fabrication process. A typical means of growing carbon nanotubes on a substrate is to use chemical vapor deposition (CVD) techniques with catalyst activation. This technique requires a relatively high growth temperature, thereby increasing the production cost. It is also difficult to achieve a film with uniform properties over a large area. Other methods, such as screen-printing or dispensing, have been developed to deposit CNTs in paste or ink composites. The composites consist of CNT powder mixed with conductive or non-conductive particles, carriers or vehicles and binders in some cases. The size and shape of the patterns created by these techniques are often non-uniform from spot to spot resulting in a non-uniform effective emitting area for each pixel or subpixel. Furthermore, edge emission from the printed or dispensed CNT composite ink or paste commonly results in non-uniformity performance of the CNT cathode, making the cathode fabrication process unpredictable.

For FED applications, depositing the same amount of CNTs on each pixel or sub-pixel with uniform effective emitting area is a major goal for obtaining uniform emission current from an individual pixel or sub-pixel. On the other hand, ideally, CNT deposition is the last step in the cathode fabrication procedure, especially for triode structures. Once a CNT cathode is prepared, further wet chemical process or etching processes that may degrade the cathode performance should not be applied to the surface of the CNT cathode.

BRIEF DESCRIPTION OF THE DRAWINGS

For a more complete understanding of the present invention, the advantages thereof, reference is now made to the following descriptions taken in conjunction with the accompanying drawings, in which.

DETAILED DESCRIPTION

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

Figure 1A:
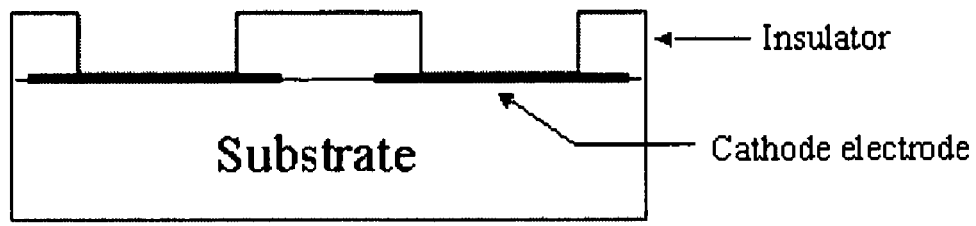
FIG. 1(a) illustrates a side view of one embodiment of a well structure.
Figure 1B:
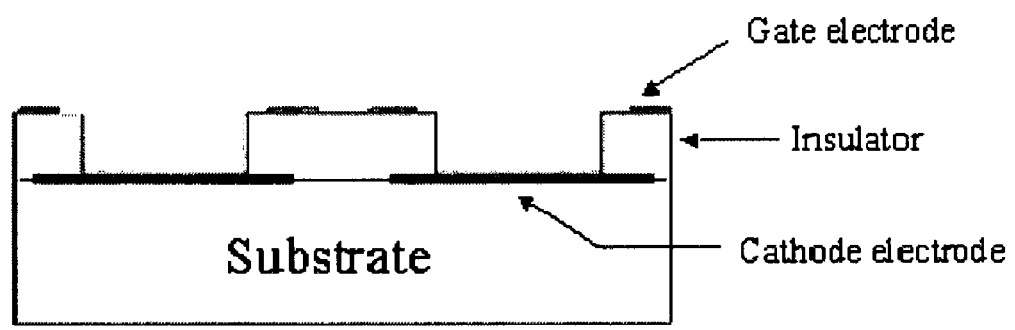
FIG. 1(b) illustrates the well structure with integrated gate electrodes.
Figure 1C:
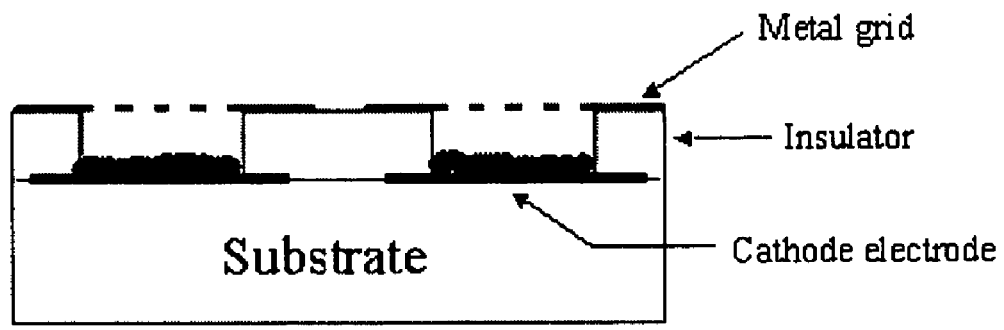
FIG. 1(c) illustrates a metal grid electrode mounted after CNT deposition in the wells.

An embodiment of the present invention provides a process for uniformly depositing CNTs into well structures as shown in FIG. 1(a). Well structures may have four or more walls to form a hole (or one wall if a round hole). The well structure may also be employed as gated, triode structures in which the grid electrodes are deposited on the top of an insulator in advance of CNT deposition (as shown in FIG. 1(b)), or a metal grid is mounted on after CNT deposition in the wells (as shown in FIG. 1(c)). The metal grid can be used to modulate the current from the CNT material placed inside the well structure, as shown in the FIG. 1(c). Both embodiments (FIGS. 1(b) and 1(c)) require CNT material inside the well structure. Each well may correspond to an individual pixel or sub-pixel. In some cases, several well structures may together be part of a pixel or sub-pixel.

Figure 2A:
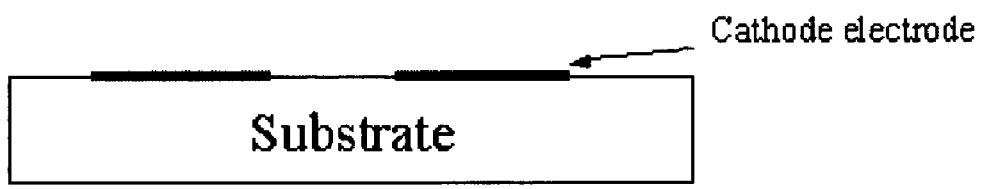
FIG. 2(a) illustrates cathode electrodes printed using a screen-printing process.
Figure 2B:
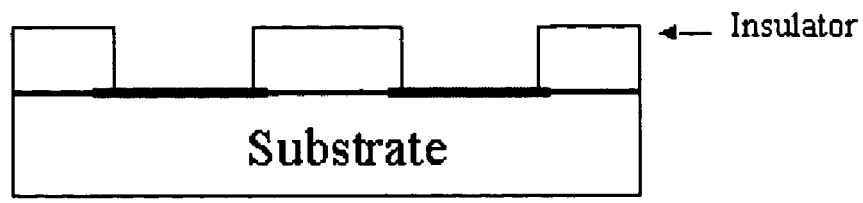
FIG. 2(b) illustrates an insulator layer printed using a screen-printing process.

The well structures can be prepared using thick film process for low-resolution applications, such as screen printing (as shown in FIGS. 2(a) and 2(b)), or using thin film process for high-resolution well structures. Cathode electrodes are printed using screen-printing. A conducting cathode electrode can also be patterned onto a substrate. The electrode lines can be defined by etching the pattern from a thin film of conducting metal deposited onto the substrate using many techniques available in the art (e.g., evaporation, sputter, CVD, etc.) The etch pattern is defined using one of several lithography techniques (e.g., optical lithography, e-beam lithography, embossing, etc). Photo-active pastes such as DuPont Fodel™ can be used to form the cathode electrode. The insulator layer may be printed using screen-printing. The walls of the well structure may also be printed using dispensing (including ink-jet printing) techniques, or they may be formed by sand or bead blasting techniques typically used in the plasma display industry. Photo-active pastes such as DuPont Fodel™ can be used to form the insulator wall structure. FIGS. 2(a) and 2(b) show fabrication of a well structure. Many materials can be used for substrates, including both insulating material (such as glass and ceramics), semiconducting materials (such as Si), or conducting materials (such as metal sheets or foils, either pure metals or metal alloys), or combinations of these materials. Low cost glass substrates may be utilized for flat panel display applications.

Figure 3A:
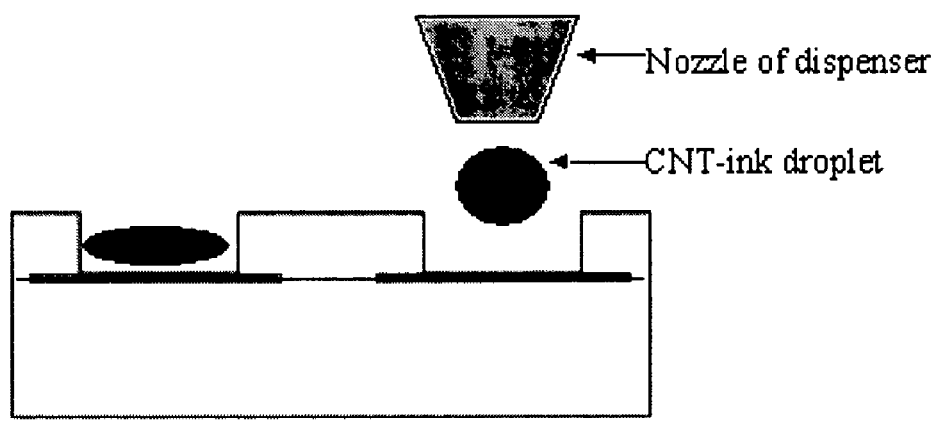
FIG. 3(a) illustrates filling the wells with a CNT ink.
Figure 3B:
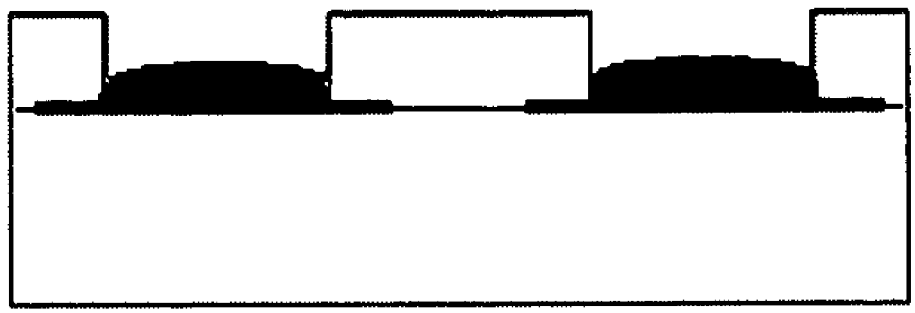
FIG. 3(b) illustrates spreading of the CNT ink within the wells.
Figure 3C:
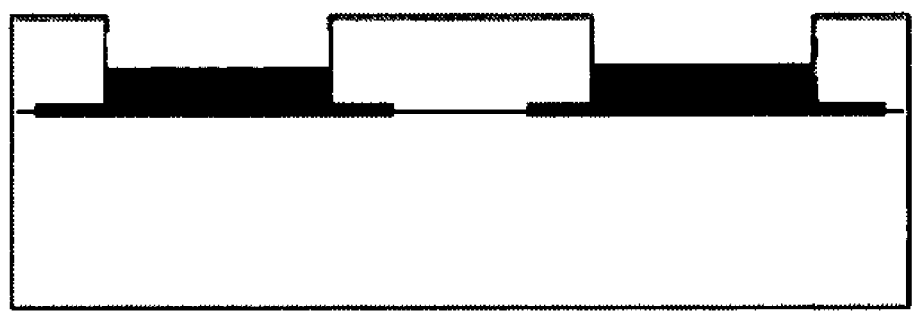
FIG. 3(c) illustrates drying of the CNT ink.

Various methods may be used to fill the well structure with the CNT ink or paste composites, such as dispensing, ink-jet printing, screen-printing, dipping, painting, brushing, spraying and spin-coating. Using the dispensing or ink-jet printing processes, the dispensing head moves relative to the substrate and is placed in position to dispense one or more drops of the ink or paste using a computer program before moving to the next spot to deposit more material (see FIG. 3(a)). In the following descriptions, a Musashi SHOT mini™ was used, although other dispensers or ink-jet dispensers may be used. The formulations may need adjusting, depending on the model and type of dispenser used. Once the fluid CNT-ink is placed in the well structure, it can cover the bottom of the well structure completely through a wetting process (see FIG. 3(b)). After drying or curing the ink or paste, the CNTs remain in the walls of pixels (see FIG. 3(c)). This process may require heat or UV (ultraviolet) curing steps, depending on the CNT ink material used. As a consequence, CNTs are contained inside the well structure. It is possible to make the well structures very accurate using printing or dispensing techniques or using sand or bead blasting processes. If the well structures are made accurately, then using the process just described will result in uniform CNT deposition for each pixel. The well structures also effectively avoid edge emission issues that may also lead to non-uniform performance. The shape of the wells can define the shape and effective emitting area of a CNT cathode for an individual pixel or sub-pixel.

Figure 4A:
FIG. 4(a) illustrates an embodiment of CNT ink inside well structures.
Figure 4B:
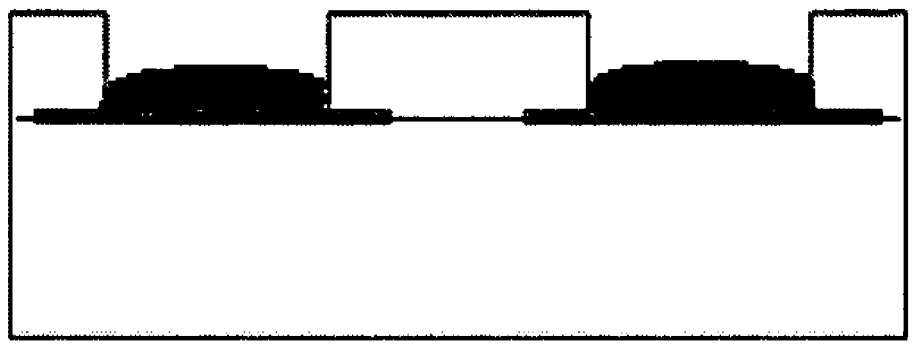
FIG. 4(b) illustrates another example of an alternative embodiment of CNT ink inside well structures.
Figure 5:
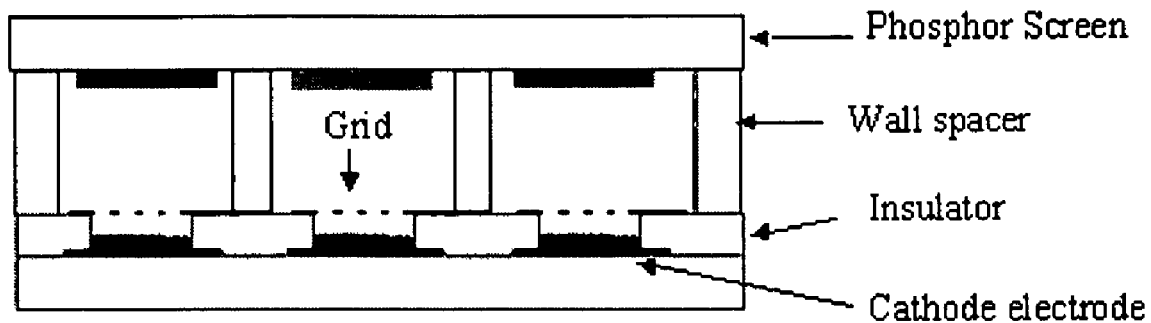
FIG. 5 illustrates a portion of a field emission display configured in accordance with an embodiment of the present invention.

To fill the wells uniformly, preparing a uniform CNT-ink or CNT-paste and controlling the volume of the ink or paste in the well are important factors. Due to hydrophilic or hydrophobia properties of the CNT ink or paste and the surface of the substrate or well structure, the CNTs can be conformed to the wells in different shapes as shown in FIGS. 4(a) and 4(b). FIG. 5 illustrates a vacuum-sealed CNT field emission display configurated with well-formation processes as described herein. The sidewall spacer (wall spacer) and the internal spacers hold the gap between the anode plate (phosphor screen) and the cathode plate after the vacuum sealed display is evacuated. Different CNT-based inks with good field emission properties have been developed according to a process (es) of the present invention. A dispenser, an inkjet printer, a screen-printer and the like and combinations thereof can be used to fill the wells with a relatively accurate volume of CNT-ink.

It is important to note that after the CNT ink is deposited to form a cathode structure, no further post-deposition processes are performed, such as the removal of sacrificial layers, which could damage the CNT ink. Such sacrificial layers are central to the processes disclosed in U.S. Pat. No. 6,705,910. Such damage to the CNT ink will adversely affect its field emission capabilities.

Examples of suitable means for filling the CNT-ink into the wells of the pixels include, but are not limited to, dispensing, inkjet printing, screen-printing, spin-on coating, brushing, dipping, and the like and combinations thereof.

The following examples are presented to further illustrate the present invention and are not to be construed as unduly limiting the scope of the present invention. The following illustrate sample formulations of CNT-ink that can be utilized according to a process of the present invention, and the field emission properties obtained with the various formulations.

SAMPLE 1 (CNT-ink 1):

1) Source of Materials: Single wall carbon nanotubes (SWNTs) were obtained from CarboLex, Inc., Lexington, Ky. The SWNTs were in a range of from 1 nm (nanometer) to 2 nm in diameter and in a range of from 5 µm (micrometers) to 20 µm in length. Single wall, double-wall, or multiwall carbon nanotubes (MWNTs) from other vendors and prepared by other methods can also be used with similar results.

The other components of the composite that were prepared were contained in an inorganic adhesive material. This inorganic adhesive material was obtained from Cotronics Corp., Brooklyn, N.Y., under the name/identifier of Resbond 989, that is a mixture of $Al_2O_3$ particles, water, and inorganic adhesives. Composites that contain other particles may also be used, such as $SiO_2$. These particles may be insulating, conducting or semiconducting. The particle sizes may be less than 50 µm. The carrier in the Resbond 989 is believed to be water, but other carrier materials may be used and they may also be organic or inorganic. Other materials that promote other properties of this material, such as binders (e.g., alkali silicates or phosphates) may also be present in the composite in small quantities.

2) Preparation of the Mixture of Carbon Nanotubes with the Resbond 989 and Deposition onto Substrate:

Grinding of the Mixture:

A 1 gram quantity of CNT powders (40 wt. %) and a 1.5 gram quantity of Resbond (60 wt. %) were put together into a mortar. The mixture was ground using a pestle for at least half an hour in order that the mixture looked like a gel, meaning that the CNTs and $Al_2O_3$ particles did not separate with each other. Please note that different weight ratios of CNTs to Resbond may also work. Additionally, water or other carrier materials may also be added into the mixture to dilute it in order to adjust the viscosity. The mixture was then ready for depositing onto the substrate.

Applying the mixture onto the substrate and curing:

A Musashi-made dispenser (model: SHOT mini™) was employed to deposit the CNT ink mixture into the well structures Other dispenser machines can be used, including ink-jet approaches. The CNT material is placed in each of the well structures by moving the dispensing head and/or the substrate relative to each other and dispensing dots of material at predefined locations. The substrate was then dried at room temperature in air for 10 minutes, but it can also be dried (cured) in an oven at increased temperature (approximately 100° C. or higher) in order to eliminate the water faster. If the solvent contains organic materials, then an even higher temperature may be set to remove the materials. For example, up to 300° C. will be set to remove epoxy. The oven or curing vessel may contain a vacuum pump to exhaust the air out of the oven and form a vacuum inside the oven during the drying/curing process. The oven or curing vessel may also provide a gas environment or flow around the sample that further promotes curing or drying. This gas environment or flow may or may not be partially or completely from inert gases such as the noble gases or nitrogen. Ultraviolet or infrared light may also be used to aid the curing process. A surface activation process (as discussed in U.S. patent application Ser. No. 10/269,577) was applied to the CNT cathodes to improve the field emission properties.

3) The samples were then ready for field emission tests.

SAMPLE 2 (CNT-ink 2)

1) A 0.9 gram quantity of single-walled CNTs unpurified, from Iljin Nanotech Corp., Ltd., a 5.7 gram quantity of epoxies (including Ethylcellulose, 2-(2-Butoxyethoxy) Ethyl Acetate, and 2-(2-Butoxyethoxy) ethanol), and 0.5 grams of glass frit were weighed and ground in a mortar for 30 minutes with a pestle. Single wall, double wall or multiwall CNT materials may also be used and CNT materials from other vendors may also be used.

2) A 2 mL quantity of thinner (Terpineol) was then added to the mortar. Other organic materials can also be used to adjust the viscosity of the CNT ink.

3) The resulting mixture was then ground in the mortar by hand for 30 minutes.

4) After grinding the mixture in the mortar, a three-roll mill was immediately employed to further mix the resulting paste for another 30 minutes. This process is used to provide for evenly distributing the mixture components and to provide for a consistent viscosity in the resulting paste (CNT-ink 2).

5) The resulting CNT-ink 2 was then added to a syringe that was fitted to a dispenser (Musashi SHOT mini™) and was ready for use.

Dispensing Process

The following discloses a process of dispensing a CNT-ink of the present invention.

1) A reference substrate was utilized that had the same thickness of a substrate that was desired to be subjected to a depositing of a CNT-ink of the present invention to determine if the CNT-ink, and dots comprising CNT-ink, could be dispensed consistently.

2) The size of the spot of dispensed material comprising CNT-ink depended on the viscosity, nozzle size of the dispenser, and the distance (gap) between the nozzle and substrate. The smaller the nozzle opening, the more sensitive the variable of the gap between the nozzle and substrate.

3) The dispenser was programmed to adjust the substrate position to the proper location(s) and to provide for a good alignment.

4) Various programs were used for different dot patterns to fill the wells.

5) The dispensing volume of CNT-ink can be adjusted by, for example, air pressure, distance, suck-back vacuum, viscosity of the dispensing material, and the size of the nozzle opening. The distance and the viscosity of dispensing materials are the most important parameters for dispensing consistently because the other parameters are more easy to control. The distance control is dependent on how flat the substrate is and the leveling of the X-Y table and also can be accurately controlled by a height sensor.

Firing Process

The following discloses a firing process of the present invention to provide for a removal of organic materials from a CNT cathode of the present invention. After the wells are filled, a firing process is needed to remove the organic materials in the CNT cathode.

1) A substrate, comprising a CNT-ink of the present invention, was subjected to baking in an oven at 100° C. for 10 minutes in air.

2) After baking, the substrate was placed into another nitrogen-flowing oven for firing. First, the temperature was slowly increased (at a rate of 180° C./hour) to 315° C. and maintained at 315° C. for 10 minutes.

3) Then, the temperature was increased (at the same ramp rate of 180° C./hour) to 450° C. and fired at 450° C. for 10 minutes.

4) The temperature was slowly decreased to room temperature (at the same ramp rate of 180° C./hour), i.e., the substrate was cooled to room temperature.

SAMPLE 3 (CNT-ink 3)

1) A 0.2 gram quantity of CNTs (obtained from Iljin Nanotech Corp., Ltd., single-wall, unpurified) was weighed using a microbalance and put into a jar. Single wall, double wall or multiwall CNT materials may also be used and CNT materials from other vendors may also be used.

2) A 0.2 gram quantity of aluminum oxide nanoparticles was then added to the jar. The size of the particles was in the range of from 0.01-0.02 µm.

3) A 5 mL quantity of thinner (Terpineol), was then added. Other organic materials can also be used to adjust the viscosity of the CNT ink.

4) With a stirrer, the mixture of CNTs, aluminum oxide nanoparticles, and terpineol was stirred for 3 hours.

5) After stirring, a three-roll mill was immediately employed to further mix the resulting ink for 30 minutes to provide for evenly distributing the mixture components and to provide for a consistent viscosity in the resulting mixture (CNT-ink 3).

6) The resulting CNT-ink 3 was then added to a syringe that was fitted to dispenser (Musashi SHOT mini™) and was ready for use.

Baking Process

The cathode made by dispensing a CNT-ink, such as CNT-ink 3, was baked in an oven at 230° C. for 30 minutes in air. The thinner can be evaporated at 230° C. without any remains or residues.

SAMPLE 4 (CNT-ink 4)

1) A 0.2 gram quantity of CNTs was weighed using a microbalance and put into a jar.

2) A 0.2 gram quantity of aluminum oxide nanoparticles was then added to the jar. The size of the particles was in the range of from 0.01-0.02 µm.

3) A 5 mL quantity of thinner (Terpineol) was then added to the jar. Other organic materials can also be used to adjust the viscosity of the CNT ink.

4) A 1 mL quantity of Kasil® 2135 was then added to the jar. The Kasil was used to improve ink adhesion to the substrate. Other inorganic materials such as potassium silicate can also be used.

5) With a stirrer, the mixture of CNTs, aluminum oxide nanoparticles, Kasil and thinner was stirred for 3 hours.

6) After stirring, a three-roll miller was immediately employed to further mix the resulting ink for 30 minutes to provide for evenly distributing the mixture components and to provide for a consistent viscosity in the resulting mixture (CNT-ink 4).

7) The resulting CNT-ink 4 was ready for use in screen-printing.

Baking Process

The CNT cathode made by screen printing was baked in an oven at 100-300° C. for 30 minutes in air. After baking, generally only inorganic materials remained in the cathode.

Field Emission Results

Figure 6A:
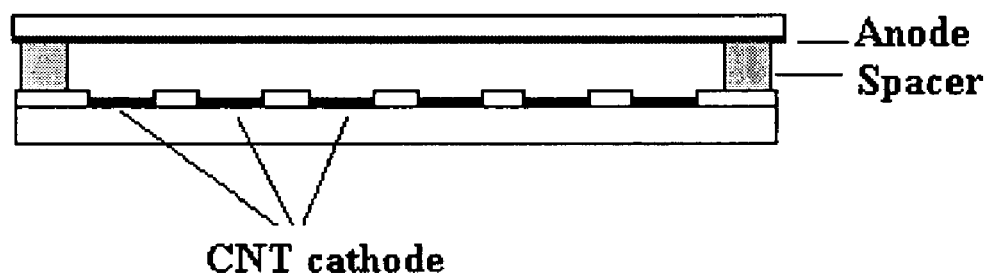
FIG. 6(a) illustrates a portion of a diode structure configured in accordance with an embodiment of the present invention.
Figure 6B:
FIG. 6(b) shows a digital image of field emission from a cathode manufactured using an embodiment of the present invention.
Figure 7:
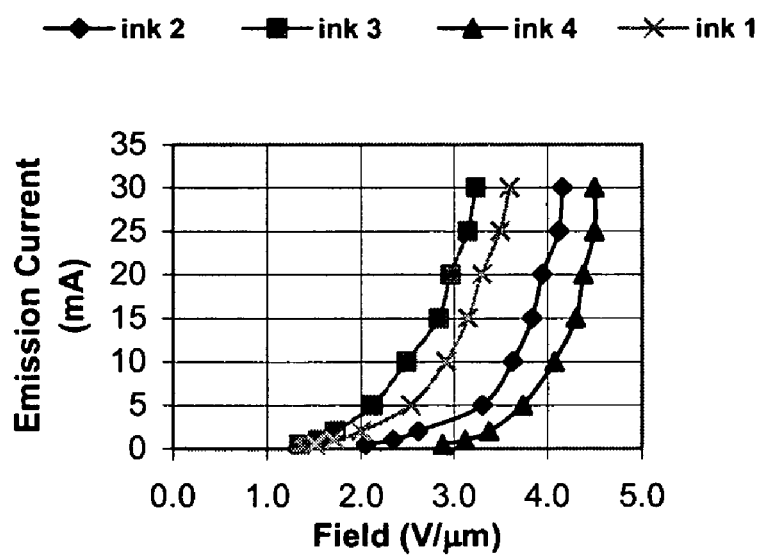
FIG. 7 illustrates I-V characteristics of CNT inks manufactured in accordance with embodiments of the present invention.

The cathodes prepared with different CNT-inks of the present invention were tested using a diode configuration as illustrated in FIG. 6(a). The spacer thickness between the cathode and anode is about 0.5 mm. The anode is ITO glass coated with phosphor. A field emission image from a cathode (CNT-ink 2) made by filling the well structure using the process described herein for CNT-ink 2 is shown in FIG. 6(b). Twenty-two pixels were in the sample. FIG. 7 shows the I-V curves from various cathodes made by the different CNT-inks prepared as previously described.

In summary, a CNT-ink is used to fill the wells of pixels using methods such as, but not limited to, dispensing or screen-printing methods. With this self-filling process, a uniform cathode can be obtained over individual pixels or sub-pixels. In addition, the edge-emission can also be reduced or eliminated.

Although the present invention and its advantages have been described in detail, it should be understood that various changes, substitutions and alterations can be made herein without departing from the spirit and scope of the invention as defined by the appended claims.

What is claimed is:

1. A process of depositing a carbon nanotube (CNT) composition in wells formed in a cathode structure whereby a post-deposition process is not performed on the cathode structure subsequent to deposition of the CNT ink-like composition, wherein the post-deposition process removes material from the cathode structure.

2. The process according to claim 1, wherein the cathode structure is a field emission cathode structure.

3. The process according to claim 1, further comprising positioning an anode in a spaced apart relationship to the cathode structure.

4. The process according to claim 1, wherein the material is a portion of the CNT ink-like composition deposited in at least one of the wells.

5. A process comprising the steps of:
   a) preparing a carbon nanotube (CNT) ink-like composition; and
   b) depositing the CNT ink-like composition in wells formed in a cathode structure whereby a post-deposition process is not performed on the cathode structure subsequent to deposition of the CNT ink-like composition.

6. The process according to claim 5 wherein said depositing comprises dispensing, screen printing, ink-jet printing, dipping, painting, brushing, spin-coating, spraying, and combinations thereof.

7. The process according to claim 5 wherein preparing a CNT ink-like composition comprises contacting carbon nanotubes, an inorganic adhesive, and water.

8. The process according to claim 5 wherein preparing a CNT ink-like composition comprises contacting carbon nanotubes, an epoxy, glass frit, and thinner.

9. The process according to claim 5 wherein preparing a CNT ink-like composition comprises contacting carbon nanotubes, aluminum oxide nanoparticles, and thinner.

10. The process according to claim 5, wherein the cathode structure is a field emission cathode structure.

11. The process according to claim 5, further comprising positioning an anode in a spaced apart relationship to the cathode structure.

12. A process of depositing a carbon nanotube (CNT) ink-like composition in wells formed in a cathode structure whereby a post-deposition process is not performed on the cathode structure subsequent to deposition of the CNT ink-like composition, wherein the post-deposition process removes a layer of material from the cathode structure.

13. The process according to claim 12, wherein the layer of material removed from the cathode structure comprises material that emits electrons.

14. The process according to claim 13, wherein the material that emits electrons is a portion of the CNT ink-like composition deposited in at least one of the wells.

* * * * *